United States Patent [19]

Sato

[11] 4,192,063
[45] Mar. 11, 1980

[54] METHOD FOR MANUFACTURING A BASE OF A SEMI-CONDUCTOR DEVICE

[76] Inventor: Yoshio Sato, 23-15, 3-chome, Zenpukuji, Suginami-ku, Tokyo, Japan

[21] Appl. No.: 871,982

[22] Filed: Jan. 24, 1978

Related U.S. Application Data

[63] Continuation-in-part of Ser. No. 744,038, Nov. 22, 1976, abandoned.

[30] Foreign Application Priority Data

Dec. 10, 1975 [JP] Japan .................................. 50-146348

[51] Int. Cl.$^2$ .......................... H01R 9/04; H01R 43/00
[52] U.S. Cl. ........................................ 29/591; 29/879; 29/882; 29/592 R; 29/DIG. 47; 228/155; 174/52 H; 357/81; 72/258
[58] Field of Search ................. 29/630 R, 630 D, 591, 29/592, 626, DIG. 47, 580, 590, 589, 576 R, 576 C, 581; 72/258, 253; 228/155; 174/52 H; 357/81

[56] References Cited

U.S. PATENT DOCUMENTS

| | | |
|---|---|---|
| 2,966,987 | 1/1961 | Kaul ........................................ 72/256 |
| 3,197,843 | 8/1965 | Nippert ................... 228/155 |
| 3,199,000 | 8/1965 | Nippert ................... 174/52 H |
| 3,279,039 | 10/1966 | Nippert ................... 228/155 |
| 3,348,297 | 10/1967 | Dijkmeijer ................ 228/155 |
| 3,918,625 | 11/1975 | Nippert ................... 228/155 |
| 4,124,935 | 11/1978 | Sato ...................... 29/592 R |

FOREIGN PATENT DOCUMENTS 7409192  1/1975  Netherlands ......................... 174/52 H

*Primary Examiner*—Daniel C. Crane
*Attorney, Agent, or Firm*—Wenderoth, Lind & Ponack

[57] ABSTRACT

A method for manufacturing a base of a semiconductor device is made up of the steps of silver soldering a metal ring of weldable and extrudable material on a metal blank of thermally and electrically conductive material to thereby form a base body; and thereafter extruding the base body so as to form a generally complete base. When the base body is extruded, a raised portion for mounting a semiconductor pellet thereon and a stud to be threaded are formed on the upper and lower surfaces of the base body, respectively and at the same time, an annular projection, which is used as a projection to weld to the upper surface of the base a shell to cover the semiconductor pellet, is formed on the upper surface of the metal ring.

2 Claims, 8 Drawing Figures

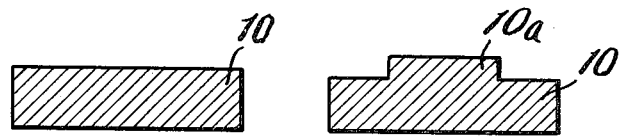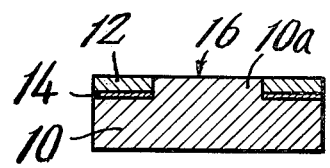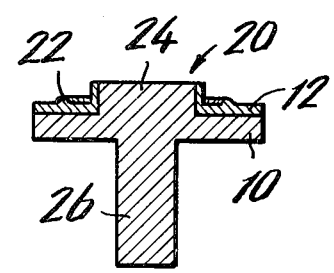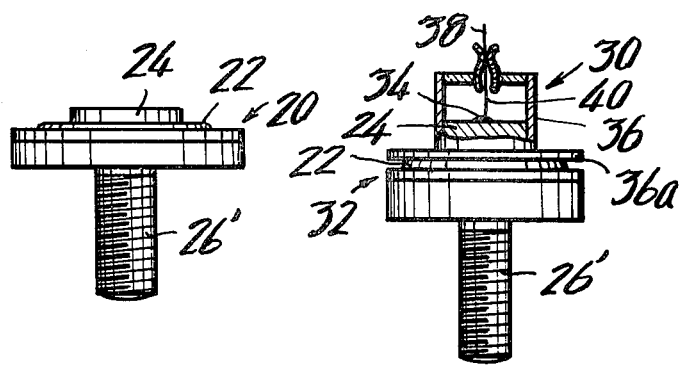

METHOD FOR MANUFACTURING A BASE OF A SEMI-CONDUCTOR DEVICE

This is a continuation-in-part of Ser. No. 744,038, filed Nov. 22, 1976.

BACKGROUND OF THE INVENTION

A stud type base of a semiconductor device comprises a base body of thermally and electrically conductive material such as copper or copper alloy having a raised portion provided on the upper surface to mount a semiconductor pellet thereon and a stud provided on the lower surface to be threaded. A shell having a hermetically sealed glass terminal or terminals is projection welded to the base on the upper surface so that the semiconductor pellet is covered, with the hermetically sealed glass terminal or terminals being connected to the semiconductor pellet. In order to accomplish this, the base is generally provided on the upper surface with a metal ring of weldable material such as iron or steel silver soldered thereto, with the metal ring having an annular projection provided thereon. In the prior art, such a base has been manufactured by silver soldering to a base body of copper or copper alloy, an iron or steel ring having an annular projection formed by cutting. Otherwise, it has been manufactured by silver soldering an iron or steel ring to a base body of copper or copper alloy and then cutting the metal ring to form an annular projection thereon. However, in these prior methods, two separate steps are required for forming the annular projection on the metal ring and extruding the base body and cause the manufacturing cost to be high. Another important disadvantage is that the strength of the bond of the iron or steel ring to the base body has been low due to a difficulty in transferring the silver of the solder to the iron of the ring during silver soldering the metal ring to the base body. Thus, the iron ring tends to come loose from the base body after the semiconductor device has been used for a long time.

SUMMARY OF THE INVENTION

Accordingly, it is a principal object of the present invention to provide a method for manufacturing a base of a semiconductor device which is made simpler by forming an annular projection on a metal ring simultaneously with extruding the base body, so that the manufacturing cost is lower.

It is another object of the present invention to provide a method for manufacturing a base of a semiconductor device wherein a metal ring can be rigidly bonded to a base body.

In accordance with the present invention, there is provided a method for manufacturing a base of a semiconductor device, comprising the steps of silver soldering a metal ring of weldable material on a metal blank of thermally and electrically conductive material to thereby form a base body, and thereafter extruding said base body so as to form a raised portion on the upper surface of said base body for mounting a semiconductor pellet thereon and at the same time forming a stud on the lower surface of said base body of the metal blank which is to be threaded later, characterized by said metal ring being of a copper-nickel alloy which is extrudable as well as weldable, and an annular projection for projection welding a shell to said base being formed on the upper surface of said metal ring when said base body is extruded.

BRIEF DESCRIPTION OF THE DRAWING

The above and other objects and features of the present invention will be apparent from the following description of an embodiment of the invention taken with reference to the accompanying drawing, in which:

FIGS. 1 to 4 illustrate the steps of manufacturing a base of a semiconductor device in accordance with the present invention, with the materials shown in cross section;

FIG. 5 is a front view of a complete base manufactured in accordance with the present invention;

FIG. 6 is a front view of an example of a semiconductor device with a portion broken away;

DETAILED DESCRIPTION OF THE EMBODIMENT

Figure 7:
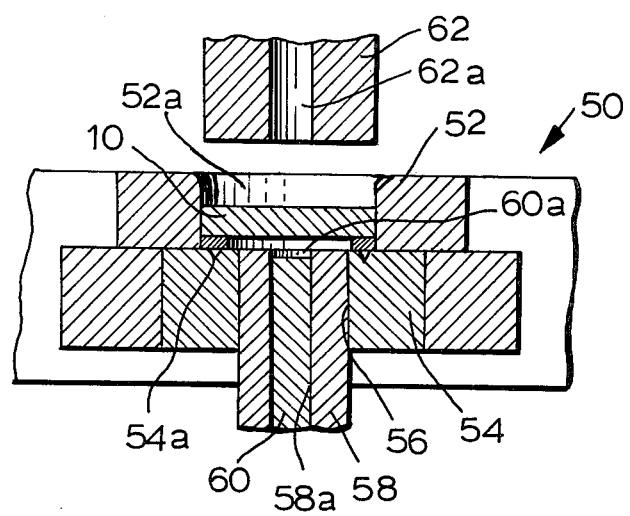
FIG. 7 is a vertical partial section of an extruder die assembly and a punch for manufacturing a base in accordance with the present invention.

With reference to the accompanying drawing, FIG. 1 shows a metal blank 10 of thermally and electrically conductive material such as copper or copper alloy, which may be zirconium-copper alloy, for example. This metal blank 10 may be formed by punching a copper or copper alloy strip into circular blanks.

The metal blank 10 is placed in a die assembly not shown and deformed to form a circular protrusion 10a on the upper surface of the metal blank 10 as shown in FIG. 2. Thereafter, a metal ring 12 which is composed of weldable and extrudable or formable material such as copper-nickel alloy called cupronickel is fitted into the circular protrusion 10a and soldered to the metal blank 10 by a silver solder 14. It should be noted that the silver of the solder 14 tends to be transferred into the copper-nickel alloy of which the metal ring 12 is composed, so as to form a solid solution of copper-nickel alloy and silver, which is impossible to obtain when the metal ring 12 is composed of iron or steel. Thus, it will be noted that the bonding strength between the metal blank 10 and the metal ring 12 is substantially improved. In FIG. 3, numeral 16 designates a base body formed in this manner.

Figure 8:
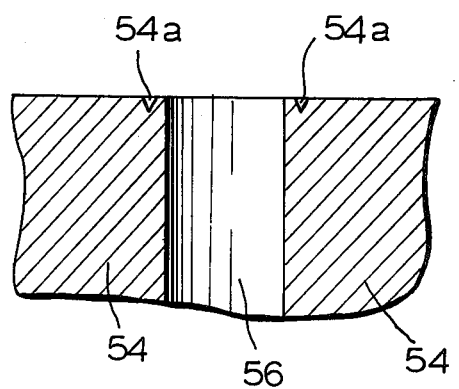
FIG. 8 is an enlarged vertical partial section of the lower die of the die assembly.

The base body 16 is then placed in an extruder die assembly 50 shown in FIG. 7. The die assembly 50 comprises an upper die 52 having a cavity 52a therein for receiving the base body 16 in an upside down position as shown in FIG. 4, and a lower die 54 having an annular groove 54a therein as shown clearly in FIG. 8 for forming an annular projection for projection welding a shell to the base. The lower die 54 is further provided with a knockout hole 56 through which a knockout cylinder 58 extends. A knockout pin 60 extends slidably through a central hole 58a in the knockout cylinder 58 to knock the product out of the die assembly 50. It should be noted that the knockout cylinder 58 and the knockout pin 60 are held in position as shown in FIG. 7 while the base body 16 is extruded in the die assembly. In FIG. 7, reference numeral 60a designates a cavity which is formed by slightly withdrawing the knockout pin 60 downwardly as shown in FIG. 7. A punch 62 has a cavity 62a for forming a stud to be threaded later. This punch is vertically movable so that the punch is struck into the cavity 52a in the upper die 52 when the base body 16 is extruded. The punch 62 may be securely mounted on a ram (not shown) of a press. In FIG. 7, the base body 16 is shown placed in the die assembly 50.

When the punch 62 is struck downwardly into the upper die 52, the base body 16 is deformed to form a half-finished base 20 as shown in FIG. 4. When the base body is deformed, since the metal ring 12 of the base body 16 is composed of extrudable and weldable copper-nickel alloy as aforementioned, it is extruded or introduced into the annular cavity 54a in the lower die 54 to form an annular projection 22 on the metal ring 12. It should be noted that since the annular cavity 54a is provided in the lower die 54 which is to be struck by the punch 62, and is in a portion of lower die 54 which constitutes the major solid portion of the lower die 54 and which surrounds and is supported during extrusion by the knockout cylinder 58, the lower die never cracks during the extrusion operation.

If the base body 16 is placed in the die with the circular protrusion upwardly and if the annular cavity for forming the annular projection 22 is provided in the punch 62, then the punch will tend to crack during the extrusion operation because the annular cavity will be positioned adjacent to the outer periphery of the punch 62.

A raised portion 24 for mounting a semiconductor pellet thereon is also formed by introducing material of the metal blank 10 into the cavity 60a in the knockout cylinder 58 during the extrusion operation.

The half-finished base 20 is then rolled to form a thread 26' on the peripheral surface of the stud 26. Thus, a complete base is manufactured as shown in FIG. 5.

FIG. 6 shows an example of a semiconductor device 30 in which a stud type base 32 manufactured in accordance with the present invention is used. The same numerals designate the same parts. A semiconductor pellet 34 is mounted on the raised portion 24. A shell 36 having a flange 36a is projection welded to the base 32 at the projection 22. A hermetically sealed glass terminal 38 can be connected to the pellet 34 by a lead 40.

While one preferred embodiment of the present invention has been illustrated and described with reference to the accompanying drawing, it will be understood that it is by way of example and that various changes and modifications may be made without departing from the spirit and scope of the invention, which is intended to be defined only by the appended claims.

I claim:

1. A method of manufacturing a base of semiconductor device, comprising the steps of; silver soldering a metal ring composed of a copper-nickel alloy which is extrudable as well as weldable on a metal blank of thermally and electrically conductive material to thereby form a base body and at the same time form the silver of the solder and the copper-nickel alloy into a solid solution of silver and cupro-nickel for improving the bonding strength between the solder and the metal ring; providing an extrusion die having a lower extrusion die portion with a knock-out hole having an axial length therein and a surface around said knockout hole with an annular recess therein concentric with said knockout hole and with said surface extending laterally outwardly away from said annular recess, a knockout member slidable in said knockout hole with said knockout member being in contact with the entire length of the knockout hole, an upper die portion having a blank receiving cavity therethrough and positioned on said surface around said knockout hole concentric therewith, and a punch slidable in said blank receiving cavity and having a central bore therein and an unrecessed surface on the end of said punch within said blank receiving cavity around said central bore, placing said metal blank in said receiving cavity with the metal ring against said lower die portion over the annular recess; and then striking the side of the base body opposite the side with the metal ring for forcing the material of the metal ring into said annular recess to form a raised annular portion on the upper surface of said base body and at the same time forming a stud on the lower surface of said base body which is to be threaded later, whereby cracks which would tend to occur in the punch if the annular recess were formed in the punch are avoided.

2. A method for manufacturing a base of a semiconductor device as set forth in claim 1, wherein the step of soldering said metal ring comprises first deforming said metal blank for forming a circular protrusion on the upper surface of said metal blank and thereafter said metal ring is fitted onto said circular protrusion and silver soldered to said metal blank.

* * * * *